(12) United States Patent
Yang et al.

(10) Patent No.: US 8,898,597 B2
(45) Date of Patent: Nov. 25, 2014

(54) ETCH FAILURE PREDICTION BASED ON WAFER RESIST TOP LOSS

(71) Applicants: Qing Yang, Singapore (SG); Shyue Fong Quek, Singapore (SG); Gek Soon Chua, Singapore (SG); Yee Mei Foong, Singapore (SG); Dong Qing Zhang, Ballston Spa, NY (US); Yun Tang, Singapore (SG)

(72) Inventors: Qing Yang, Singapore (SG); Shyue Fong Quek, Singapore (SG); Gek Soon Chua, Singapore (SG); Yee Mei Foong, Singapore (SG); Dong Qing Zhang, Ballston Spa, NY (US); Yun Tang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/835,339

(22) Filed: Mar. 15, 2013

(65) Prior Publication Data

US 2014/0282286 A1  Sep. 18, 2014

(51) Int. Cl.
G06F 17/50 (2006.01)

(52) U.S. Cl.
CPC .................. *G06F 17/5036* (2013.01)
USPC .................. 716/51; 716/50; 716/52; 716/54

(58) Field of Classification Search
USPC ............................................................. 716/51
See application file for complete search history.

(56) References Cited

U.S. PATENT DOCUMENTS

| | | | |
|---|---|---|---|
| 2006/0136862 A1* | 6/2006 | Nojima et al. | 716/21 |
| 2007/0032896 A1* | 2/2007 | Ye et al. | 700/108 |
| 2008/0185538 A1* | 8/2008 | Ohnishi et al. | 250/492.22 |
| 2011/0099529 A1* | 4/2011 | Heng et al. | 716/106 |

\* cited by examiner

*Primary Examiner* — Vuthe Siek
*Assistant Examiner* — Eric Lee
(74) *Attorney, Agent, or Firm* — Ditthavong & Steiner, P.C.

(57) ABSTRACT

An approach for methodology, and an associated apparatus, enabling a simulation process to check integrity of the design and predict a manufacturability of a resulting circuit that accounts for process latitude without a long turnaround time and/or a highly skilled engineer is disclosed. Embodiments include: determining first and second features of an IC design; determining a thickness of a resist layer of the IC design based on an aerial image of the IC design; determining a threshold value according to the thickness; and comparing the threshold value to a separation distance between the first and second features.

15 Claims, 7 Drawing Sheets

US 8,898,597 B2

ETCH FAILURE PREDICTION BASED ON WAFER RESIST TOP LOSS

TECHNICAL FIELD

The present disclosure relates to generating a computer simulation modeling a manufacturability of integrated circuit (IC) designs. The present disclosure is particularly applicable to IC designs utilizing 28 nanometer (nm) technology nodes and beyond and utilizing a high-NA immersion lithography process.

BACKGROUND

In IC designs, computer simulation processes are used to check integrity of the design and predict a manufacturability of a resulting circuit. As semiconductor technology is moving to smaller technology nodes, process latitude, due to decreasing lithography tool focus margin, is of increasing importance in a manufacturability of a resulting device. Tool focus fluctuation has an impact on resist pattern shape, which not only changes wafer CD, but also decreases pattern height. It is implicit that the resist loss influences pattern formation after etching, and resist loss is important for process control. However, some traditional processes may utilize a two-dimensional tool that fails to account for process latitude. Some three-dimensional models, such as AFM or cross-sectional SEM, may be configured to account for a process latitude, but are computationally intensive and require a highly skilled engineer, resulting in a very long turnaround time. As such, three-dimensional models are frequently utilized off-line and after a mask writing step.

A need therefore exists for methodology and an apparatus enabling a simulation process to check integrity of the design and predict a manufacturability of a resulting circuit that accounts for process latitude without a long turnaround time and a highly skilled engineer.

SUMMARY

An aspect of the present disclosure is a method of comparing a separation distance between features with a threshold value based on an aerial image.

Another aspect of the present disclosure is an apparatus for comparing a separation distance between features with a threshold value based on an aerial image.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining first and second features of an IC design; determining a thickness of a resist layer of the IC design based on an aerial image of the IC design; determining a threshold value according to the thickness; and comparing the threshold value to a separation distance between the first and second features.

Aspects include initiating a modification of a positioning of the first and/or second features based on the comparison. Additional aspects include a method, wherein the determination of the threshold value further includes: determining a thickness of the resist layer within a region of the IC design containing the first and second features, wherein the threshold value is determined according to the thickness within the region. Some aspects include determining a nominal threshold value for the entire IC design, wherein the threshold. Further aspects include modifying the nominal threshold and/or the threshold value based on an etch failure between the first and second features in a resulting IC circuit of the IC design. Some aspects include comparing the threshold value to a second separation distance between the first feature and a third feature, the third feature being within the region. Additional aspects include indicating the region as a hotspot based on the comparison. Further aspects include a method, wherein the comparison is before a mask write and/or wafer printing of a resulting IC circuit corresponding to the IC design and is in real-time.

Another aspect of the present disclosure is an apparatus having: at least one processor; and at least one memory including computer program code for one or more programs, the at least one memory and the computer program code configured to, with the at least one processor, cause the apparatus to perform at least the following, determine first and second features of an IC design; determine a thickness of a resist layer of the IC design based on an aerial image of the IC design; determine a threshold value based on the thickness; and compare the threshold value to a separation distance between the first and second features.

Aspects include an apparatus further caused to initiate a modification of a positioning of the first and/or second features based on the comparison. Additional aspects include an apparatus, wherein the determination of the threshold value further includes determining a thickness of the resist layer within a region of the IC design containing the first and second features, wherein the threshold value is determined according to the thickness within the region. Further aspects include an apparatus configured to determine a nominal threshold value for the IC design, wherein the threshold value is further based on the nominal threshold. Some aspects include an apparatus further caused to determine a nominal threshold value for the IC design, wherein the threshold value is further based on the nominal threshold. Additional aspects include an apparatus further configured to modify the nominal threshold and/or the threshold value based on an etch failure between the first and second features in a resulting IC circuit of the IC design. Some aspects include an apparatus further configured to compare the threshold value to a second separation distance between the first feature and a third feature, the third feature being within the region. Further aspects include an apparatus further caused to indicate the region as a hotspot based on the comparison. Additional aspects include an apparatus, wherein the comparison is before a mask write and/or wafer printing of a resulting IC circuit corresponding to the IC design and is in real-time.

Another aspect is a method including: determining a plurality of features in first and second window regions of an IC design; determining a first and second thickness of a resist layer for the first and second window regions, respectively, based on an aerial image of the IC design; determining first and second window threshold values for the first and second window regions, respectively, based on the first and second thicknesses, respectively, and a nominal threshold value for the IC design; determining first and second separation distances between features of the plurality of features within the first and second window regions, respectively; and comparing, in real-time, the first and second window threshold values to the first and second separation distances, respectively, before a mask write and wafer printing of a resulting IC circuit corresponding to the IC design.

Some aspects include initiating a modification of a positioning of at least one of the plurality features based on the comparison. Further aspects include modifying the nominal threshold, the first window threshold value, the second window threshold value, or a combination thereof, based on an etch failure between at least two of the features in the resulting IC circuit. Additional aspects include indicating the first and/or second window region as a hotspot based on the comparison.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of intensive computations, high skilled engineering requirements, and very long turnaround time attendant upon predicting a manufacturability of a design with decreased lithography tool focus margin, decreased process latitude, variations in wafer CD, and decreased pattern height from utilizing a high-NA immersion lithography process and/or pixilated source (SMO) process, particularly in devices for the 32 nm technology node and beyond. The present disclosure addresses and solves such problems, for instance, by, inter alia, determining a threshold value based on a profile of a resist layer in an aerial image.

Methodology in accordance with embodiments of the present disclosure includes: determining first and second features of an IC design; determining a thickness of a resist layer of the IC design based on an aerial image of the IC design; determining a threshold value according to the thickness; and comparing the threshold value to a separation distance between the first and second features.

Figure 1:
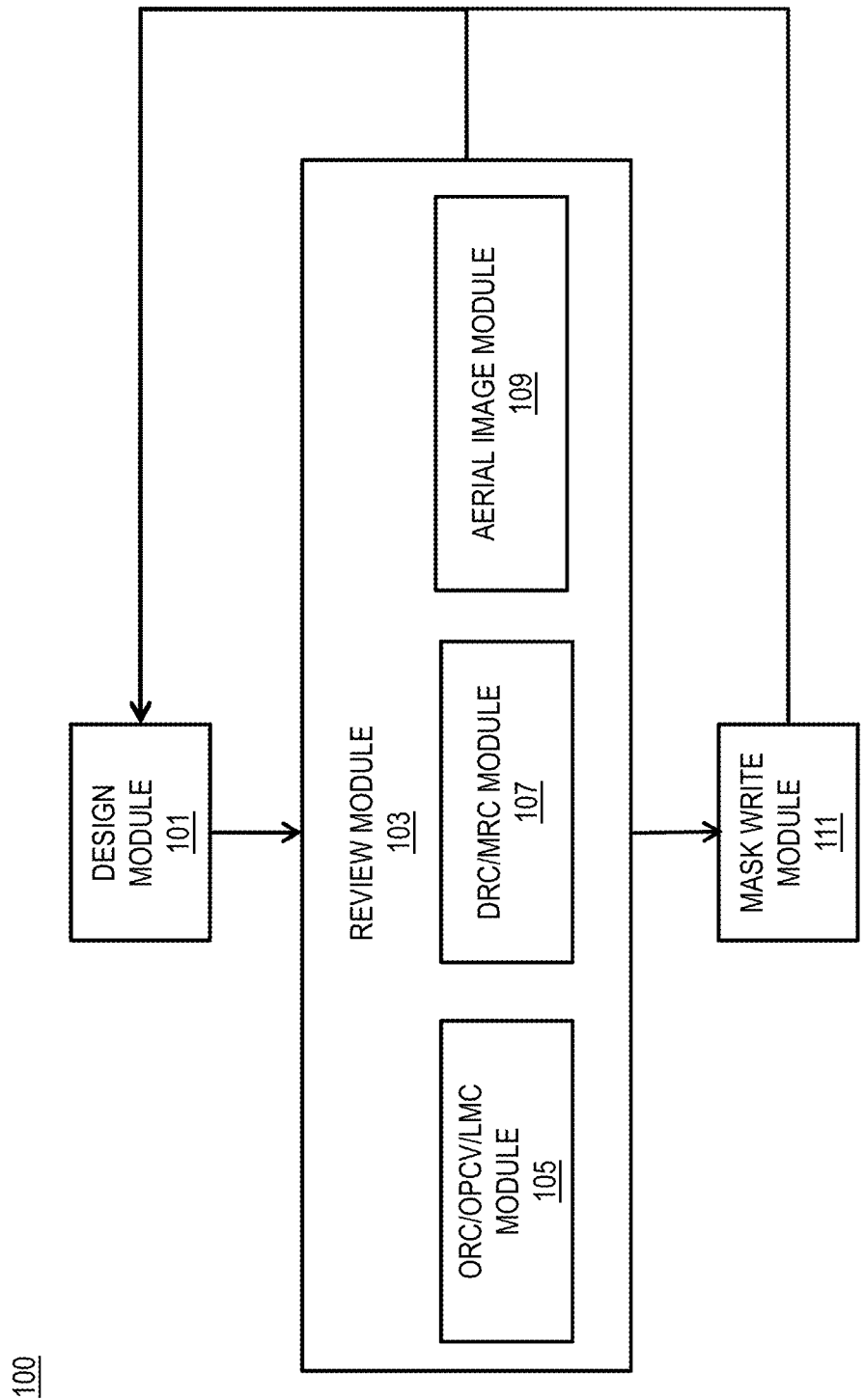
FIG. 1 is a system configured to predict a manufacturability of a resulting circuit in an exemplary embodiment.

Adverting to FIG. 1, a system 100 includes design module 101, review module 103 having modules 105-109, and mask write module 111. Modules 101, 103, and 111 may be combined. Design module 101 is configured to generate an IC design by, for instance, a placement and routing (P&R) step, a decomposition of metal routes into mandrel and block masks, and the like. Additionally design module 101 is configured to perform a GDSIN, boolean, OPC, GDSOUT, and ORC/OPCV/LMC/DRC/MRC, and the like, of an IC design.

Review module 103 includes an aerial image based resist module 109 and includes an ORC/OPCV/LMC module 105 and/or a DRC/MRC module 107. Review module 103 is configured to verify (and validate) a design, for instance, generated by design module 101. The ORC/OPCV/LMC module 105 is configured to determine patterning failures and electronic function failures impacting a yield of a resulting design. Additionally module 105 is configured to perform various yield improvement functions, for example, a full chip intensity/slope/DoF/MEEF check, a non-redundancy contact/via check, and a resist top loss detection. The DRC/MRC module 107 is configured to perform design related DRCs, OPC target related checks, and a MRC check. AI module 109 is configured to determine a profile of a resist layer of an IC design using an aerial image and to generate threshold values relating to a critical distance between features of the IC design, based on the profile. The AI 109 may be configured to establish a closed-loop feedback flow in real-time for OPC to correct for resist loss and resist pattern shape (e.g., thickness, gradient, etc.) thereby allowing early insight into process limitations of prospective ground rules for early technology development, an improved patterning quality for improving yield, a and a shorter turn-around time. Additionally, AI module 109 may determine a nominal threshold value for an IC design based on a full chip simulation of the IC design and a defined specification (e.g., a design parameter).

Mask write module 111 is configured to write a mask based on the IC design, to prepare a wafer for print down of the IC design, and to verify lithography performance. As shown in FIG. 1, mask write module 111 may initiate a modification of the design. However, after a mask write process such modifications may cost ten times more than before the mask write process. Additionally mask write module 111 determines if a design is qualified for OPC for a full chip, and initiates a target generation, nominal OPC step, process window OPC, 3D OPC, and the like before initiating a redesign, for instance, by design module 101.

Figure 2:
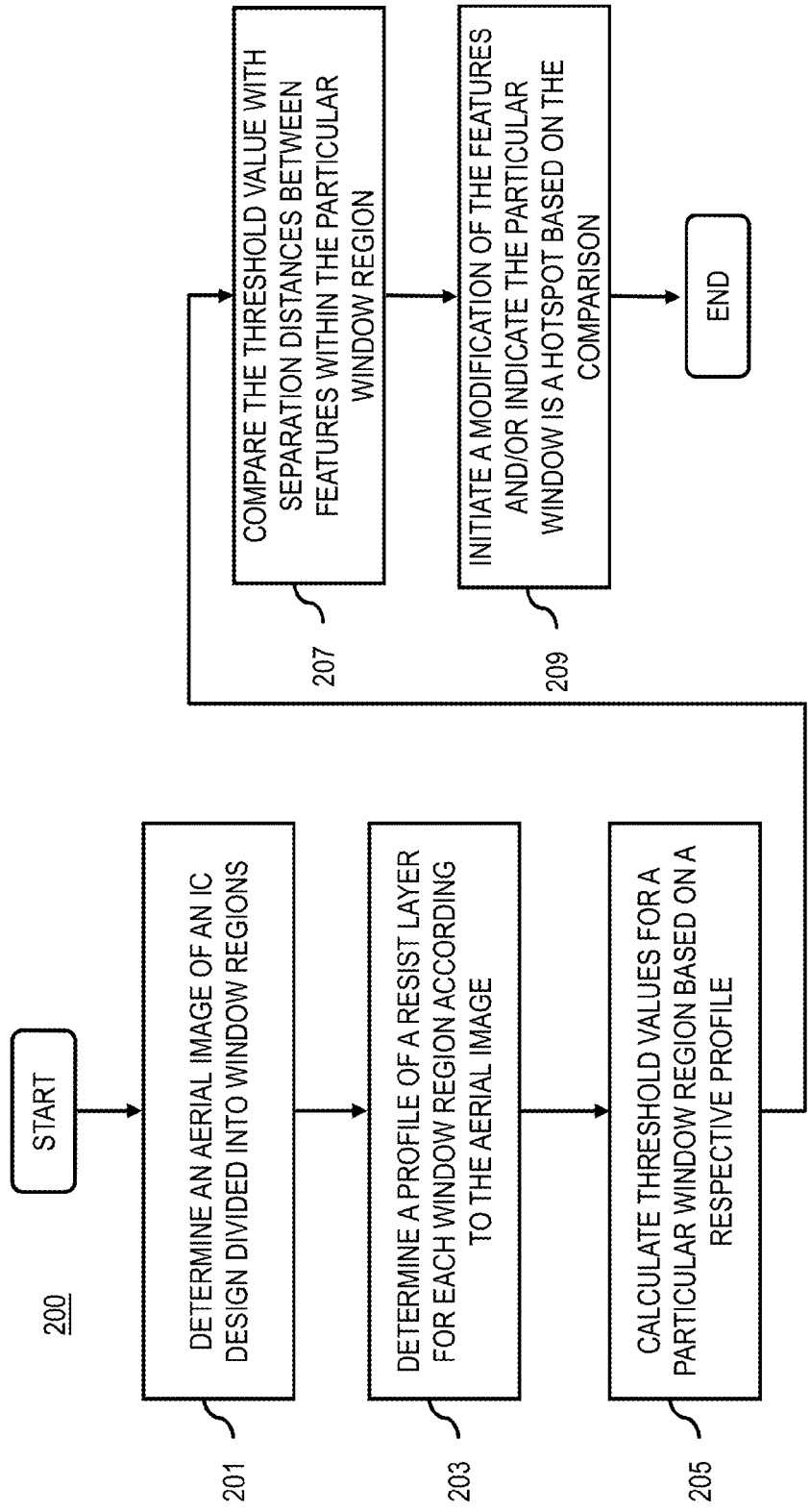
FIG. 2 is a flowchart of a process for predicting a manufacturability of a resulting circuit in an exemplary embodiment.
Figure 7:
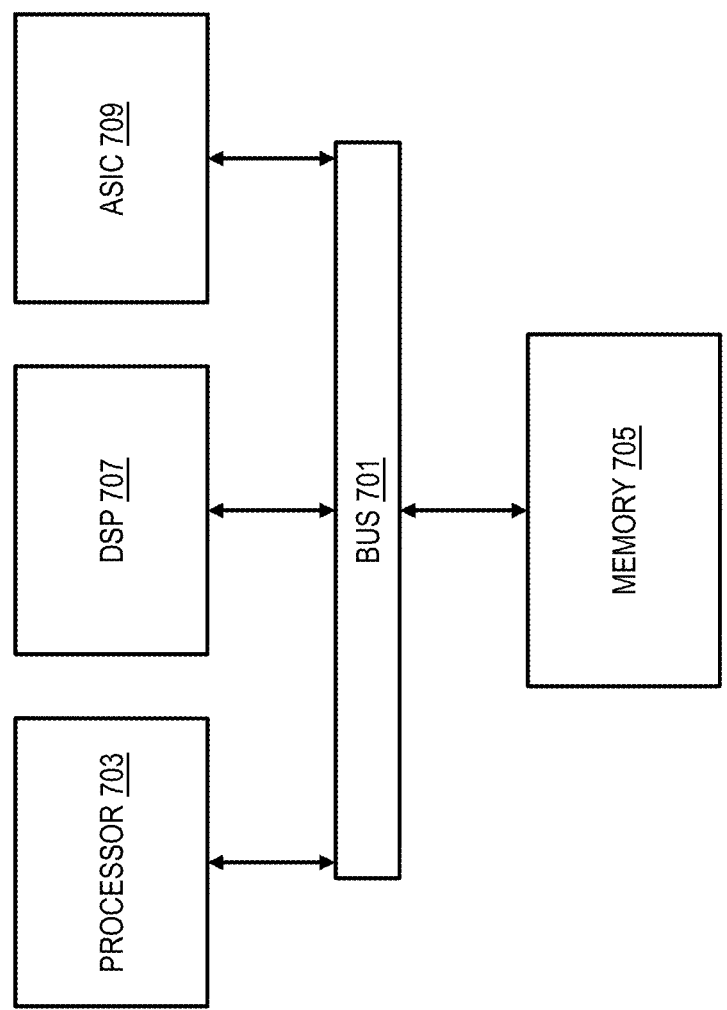
FIG. 7 is a diagram of a chip set that can be used to implement exemplary embodiments.

FIG. 2 is a flowchart of a process 200 for determining a manufacturability of a resulting design, according to an exemplary embodiment. Process 200 may be implemented in, for instance, a chip set including a processor and a memory as shown in FIG. 7.

Figure 5:
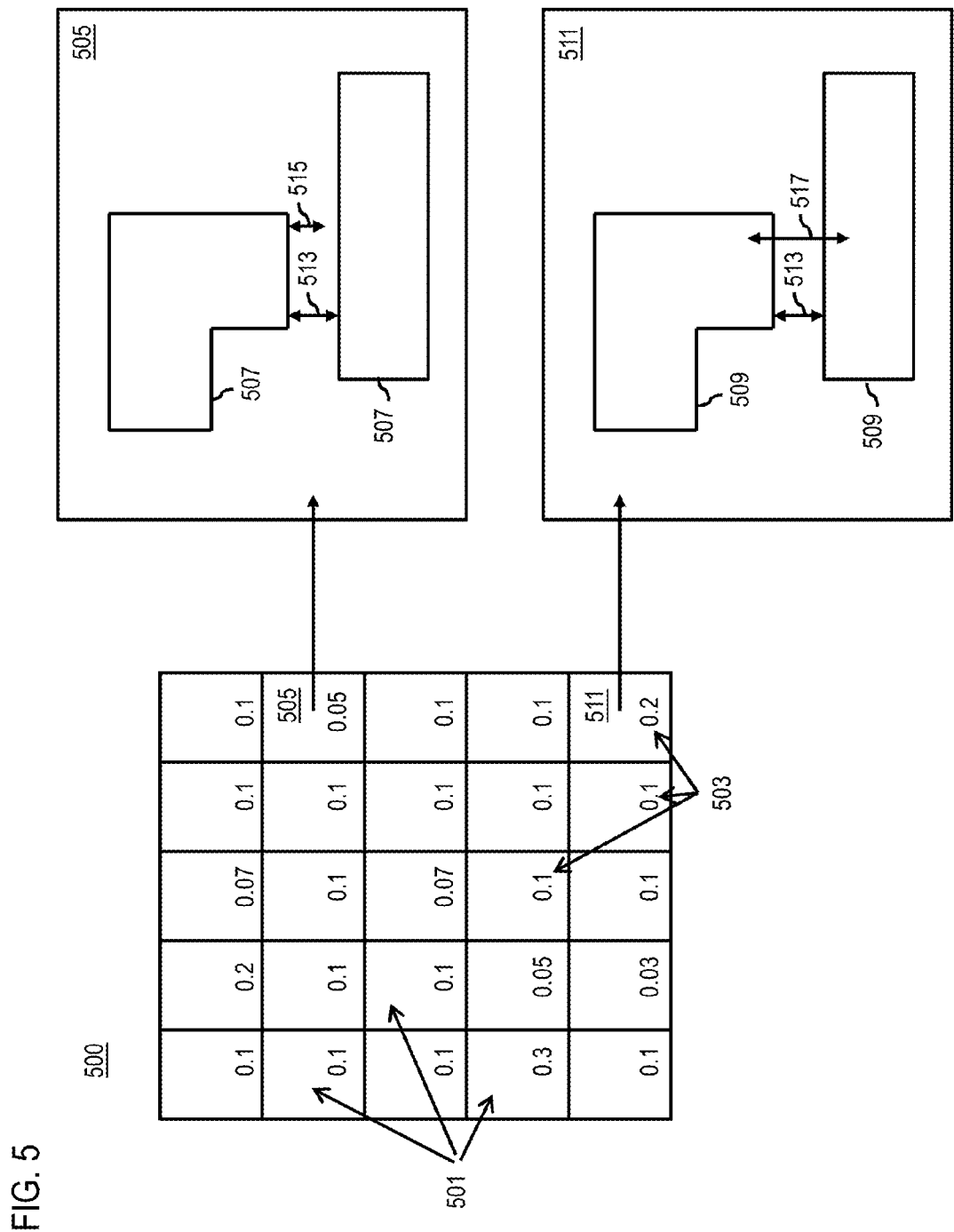
FIG. 5 illustrates threshold values of windows of an IC design in an exemplary embodiment.

In step 201, the AI module 109 determines an aerial image of an IC design divided into window regions (discussed with respect to FIG. 5). Next, the AI module 109 determines, as in step 203, a profile (e.g., thickness, gradient, etc.) of a resist layer for each window region according to the aerial image. For instance, the AI module 109 determines an average thickness of a resist layer in a particular window and associates the average (median or mode) thickness to the particular window. In another example, the AI module 109 associates a maximum (or minimum) resist layer thickness to a particular window.

Adverting to step 205, the AI module 105 calculates a threshold value for each of the window regions based on a respective profile. For example, the AI module 105 calculates a threshold value 'CDmin' based on the following:

$$CD\ min = w1 * thickness + nom\_CD$$

where 'w1' is a weight value determined based on a comparison of simulated data of an IC design with test values of a resulting design, thickness is the thickness of a resist layer for a window of step 203, and nom_CD is a nominal critical distance value for the IC design, determined based on a comparison of simulated data of the IC design with test values of the resulting design.

Next, as in step 207, the AI module 109 compares the threshold values with separation distances between features within a particular window region. For example, the AI module 109 determines whether each feature within a particular window exceeds (or is within) the threshold value for the particular window calculated in step 205. The AI module 109 then, as in step 209, initiates a modification of the features and/or indicates the particular window as a hotspot based on the comparison. For instance, the AI module 109 initiates design module 101 to further separate features separated by a distance within (or exceeding) the threshold value. Additionally, or alternatively AI module 109 associates a hotspot value (e.g., color, number, etc) with the particular window based on a difference between an average (e.g., mode, median), minimum, and/or maximum separation distance of features within the particular window to the threshold value or based on a number of separation distances within the particular window that exceed (or are within) the threshold value.

Figure 3:
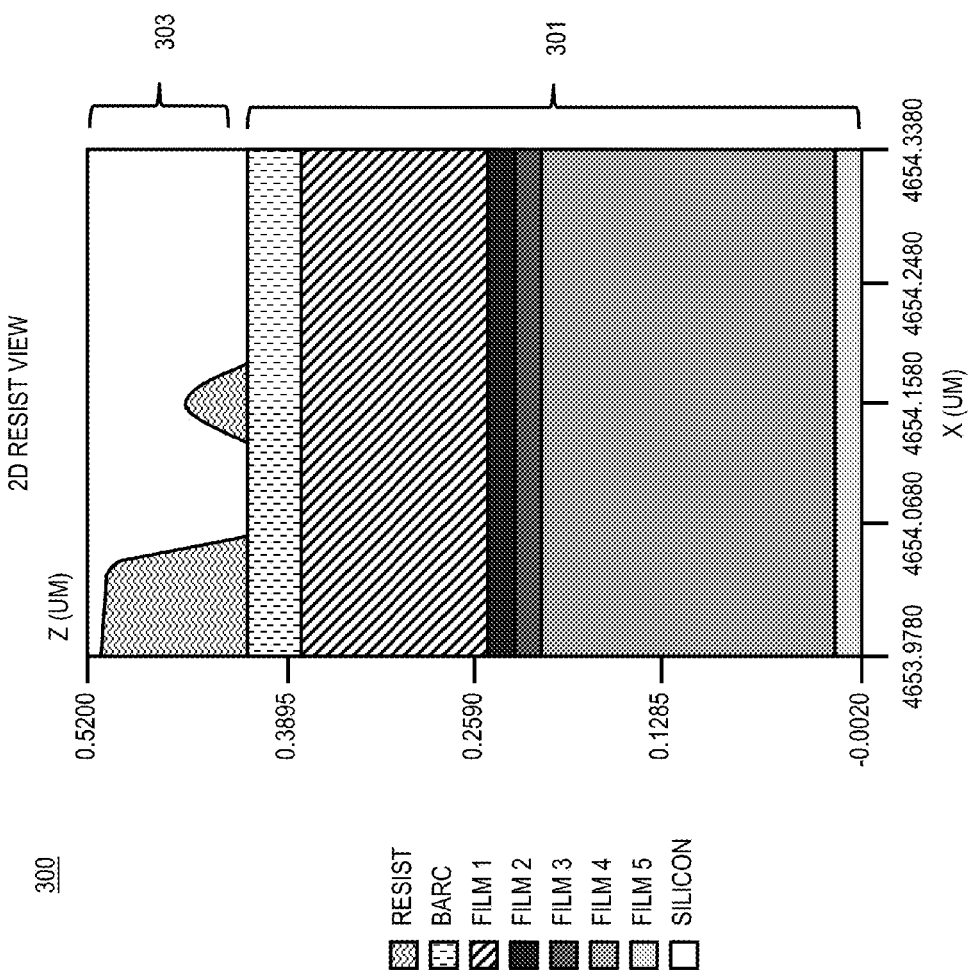
FIG. 3 illustrates a three-dimensional model in an exemplary embodiment.

FIG. 3 illustrates a three-dimensional model in an exemplary embodiment. As shown, the three-dimensional model 300 includes various layers 301 and a resist layer 303. As illustrated in FIG. 3, a profile of resist layer 303 may be determined based on an aerial image model because the resist layer 303 forms the profile of the three-dimensional model 300. Furthermore, resist loss in the resist layer 303 may result in tool focus fluctuation impacting a resist pattern shape that changes a wafer critical distance and reduces a pattern height. As such, a profile of resist layer 303 (and accounting for resist loss) is important for process control. However, as noted above, traditional methods may lack closed-loop feedback flow to adjust to a profile of resist layer 303 (and for resist loss) prior to mask write and wafer print down. The process illustrated in FIG. 2 allows a closed-loop feedback flow enabling an adjusting to a profile of resist layer 303 (and for resist loss) prior to mask write and wafer print down by, inter alia, utilizing an aerial image.

Figure 4:
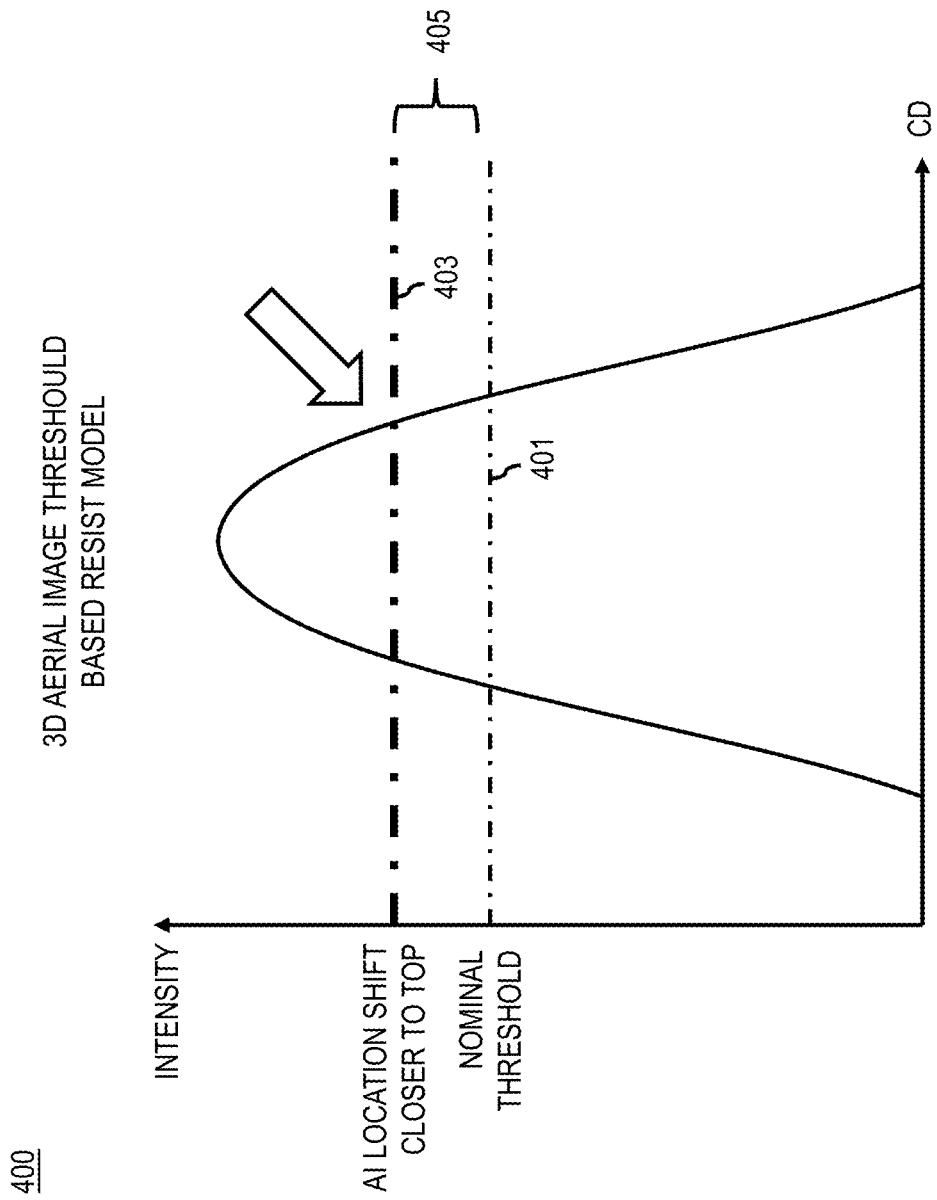
FIG. 4 illustrates an aerial image threshold based resist model in an exemplary embodiment.

FIG. 4 illustrates an aerial image threshold based resist model in an exemplary embodiment. Adverting to FIG. 4, a nominal threshold 401 is adjusted to a modified threshold 403. For example, a window may contain a higher intensity aerial image, determined, for instance, based on a thickness and/or gradient of a resist layer in an aerial image than a nominal or average value of the IC design. As such, a region 405 of the curve indicates additional devices may result in failure of a resulting device due to manufacturing tolerances.

FIG. 5 illustrates threshold values of windows of an IC design in an exemplary embodiment. As shown, an IC design 500 is divided into cells 501, each cell having a resist layer profile (e.g., thickness) value 503 based on an aerial image of the IC design. Additionally, a first cell 505 includes features 507 positioned identically to features 509 of second cell 511. However, due to the resist layer profile values 503, a nominal critical distance of 513 is shifted to first threshold value 515 and second threshold value 517. Therefore, features 507 of the first cell 505 are determined to have manufacturability within a specification and features 509 of the second cell 511 are determined to have a manufacturability exceeding the specification.

Figure 6:
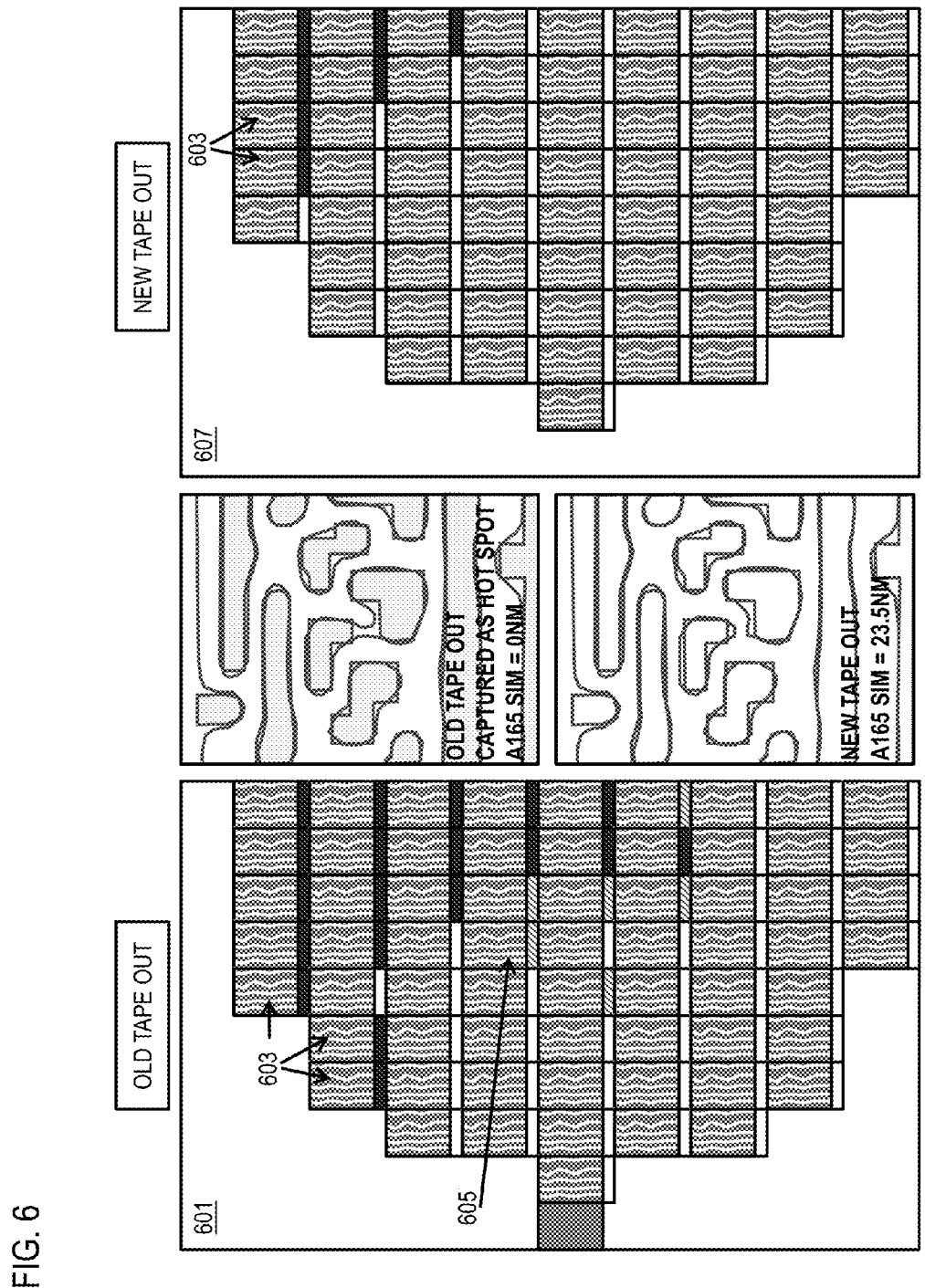
FIG. 6 illustrates a reduction of hotspots utilizing an aerial image in an exemplary embodiment.

FIG. 6 illustrates a reduction of hotspots utilizing an aerial image in an exemplary embodiment. As shown, a first tape-out 601 includes many hotspot window regions 603 and 605. A bridging alarm may be used to indicate the hotspots in window regions 603 and 605. However, as the processes illustrated in FIG. 2 may be performed in real-time and before a mask write and/or wafer printing of an IC design, IC designs may be modified to reduce a number of hotspot window regions 603 and 605 as shown in the second tape-out window 607. Therefore, a manufacturability of a resulting design may be improved in real-time, prior to a mask write and/or wafer printing of the IC design without a long turn-around time by utilizing an aerial image based threshold value.

FIG. 7 is a diagram of a chip set that can be used to implement various exemplary embodiments. Chip set 700 is programmed to provide for methodology enabling a prediction of a manufacturability of a resulting circuit as described herein and includes, for instance, the processor and memory components described with respect to FIG. 7 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in exemplary embodiments the chip set can be implemented in a single chip. Chip set 700, or a portion thereof, constitutes a means for performing one or more steps of FIG. 2.

The chip set 700 may include a communication mechanism such as a bus 701 for passing information among the components of the chip set 700. A processor 703 has connectivity to the bus 701 to execute instructions and process information stored in, for example, a memory 705. The processor 703 may include one or more processing cores with each core configured to perform independently. A multi-core processor enables multiprocessing within a single physical package. Examples of a multi-core processor include two, four, eight, or greater numbers of processing cores. Alternatively or in addition, the processor 703 may include one or more microprocessors configured in tandem via the bus 701 to enable independent execution of instructions, pipelining, and multithreading. The processor 703 may also be accompanied by one or more specialized components to perform certain processing functions and tasks such as one or more digital signal processors (DSP) 707, or one or more application-specific integrated circuits (ASIC) 709. A DSP 707 typically is configured to process real-world signals (e.g., sound) in real time independently of the processor 703. Similarly, an ASIC 709 can be configured to perform specialized functions not easily performed by a general purpose processor. Other specialized components to aid in performing the inventive functions described herein include one or more field programmable gate arrays (FPGA) (not shown for illustrative convenience), one or more controllers (not shown for illustrative convenience), or one or more other special-purpose computer chips.

The processor 703 and accompanying components have connectivity to the memory 705 via the bus 701. The memory 705 includes both dynamic memory (e.g., RAM, magnetic disk, writable optical disk, etc.) and static memory (e.g., ROM, CD-ROM, etc.) for storing executable instructions that when executed perform the inventive steps described herein. The memory 705 also stores the data associated with or generated by the execution of the inventive steps.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

The embodiments of the present disclosure can achieve several technical effects, including electronic computer simulations capable of verifying integrity of a design and predicting manufacturability of a resulting circuit prior to a mask write and/or wafer printing. The present disclosure enjoys industrial applicability in any of electronic computer simulation of highly integrated semiconductor devices, including logic or high voltage technology nodes from mainstream to advanced devices, particularly in IC designs for 32 nm technology nodes and beyond and in IC designs utilizing a high-NA immersion lithography process.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   determining first and second features of an integrated circuit (IC) design;
   determining, prior to a mask write and to wafer print down of a resulting IC circuit corresponding to the IC design, a thickness of a resist layer of the IC design indicated by a profile of an aerial image of the IC design;
   determining a threshold value according to the thickness by determining a thickness of the resist layer within a region of the IC design containing the first and second features, wherein the threshold value is determined according to the thickness within the region;
   comparing, by a processor, the threshold value to a separation distance between the first and second features prior to the mask write and to wafer print down;
   determining a nominal threshold value for the entire IC design, wherein the threshold value is further based on the nominal threshold; and
   comparing, by the processor, each feature within the region of the IC design with the threshold value;
   wherein the threshold value is a summation of the nominal threshold value and a weighted value of the thickness.

2. The method according to claim 1, comprising:
   initiating, prior to the mask write and wafer print down, a modification of a positioning of the first and/or second features based on the comparison.

3. The method according to claim 1, comprising:
   modifying the nominal threshold and/or the threshold value based on an etch failure between the first and second features in a resulting IC circuit of the IC design.

4. The method according to claim 1, comprising:
   comparing the threshold value to a second separation distance between the first feature and a third feature, the third feature being within the region.

5. The method according to claim 1, comprising:
   indicating the region as a hotspot based on the comparison.

6. An apparatus comprising:
   at least one processor; and
   at least one memory including computer program code for one or more programs,
   the at least one memory and the computer program code configured to, with the at least one processor, cause the apparatus to perform at least the following,
   determine first and second features of an integrated circuit (IC) design;
   determine, prior to a mask write and to wafer print down of a resulting IC circuit corresponding to the IC design, a thickness of a resist layer of the IC design indicated by a profile of an aerial image of the IC design;
   determine a threshold value based on the thickness by determining a thickness of the resist layer within a region of the IC design containing the first and second features, wherein the threshold value is determined according to the thickness within the region;
   compare the threshold value to a separation distance between the first and second features prior to the mask write and to wafer print down;
   determine a nominal threshold value for the IC design, wherein the threshold value is further based on the nominal threshold; and
   compare each feature within the region of the IC design with the threshold value;
   wherein the threshold value is a summation of the nominal threshold value and a weighted value of the thickness.

7. The apparatus according to claim 6, wherein the apparatus is further caused to:
   initiate a modification of a positioning of the first and/or second features based on the comparison.

8. The apparatus according to claim 6, wherein the apparatus is further caused to:
   modify the nominal threshold and/or the threshold value based on an etch failure between the first and second features in a resulting IC circuit of the IC design.

9. The apparatus according to claim 6, wherein the apparatus is further caused to:
   compare the threshold value to a second separation distance between the first feature and a third feature, the third feature being within the region.

10. The apparatus according to claim 6, wherein the apparatus is further caused to:
    indicate the region as a hotspot based on the comparison.

11. The apparatus according to claim 6, wherein the comparison is in real-time.

12. A method comprising:
    determining a plurality of features in first and second window regions of an integrated circuit (IC) design;
    determining, prior to a mask write and to wafer print down of a resulting IC circuit corresponding to the IC design, a first and second thickness of a resist layer for the first and second window regions, respectively, indicated by a profile of an aerial image of the IC design;
    determining first and second window threshold values for the first and second window regions, respectively, based on the first and second thicknesses, respectively, and a nominal threshold value for the IC design;

determining first and second separation distances between features of the plurality of features within the first and second window regions, respectively; and comparing, in real-time and by a processor, the first and second window threshold values to the first and second separation distances, respectively, before the mask write and wafer printing, wherein the first and second window threshold values are summations of the nominal threshold value and a weighted value of the first and second thickness, respectively.

13. The method according to claim 12, comprising:
initiating a modification of a positioning of at least one of the plurality features based on the comparison.

14. The method according to claim 12, comprising:
modifying the nominal threshold, the first window threshold value, the second window threshold value, or a combination thereof, based on an etch failure between at least two of the features in the resulting IC circuit.

15. The method according to claim 12, comprising:
indicating the first and/or second window region as a hotspot based on the comparison.

* * * * *